United States Patent
Yokote et al.

(10) Patent No.: US 10,727,373 B2
(45) Date of Patent: Jul. 28, 2020

(54) LIGHT EMITTING DIODE, METHOD FOR MANUFACTURING LIGHT EMITTING DIODE, LIGHT EMITTING DIODE DISPLAY DEVICE, AND METHOD FOR MANUFACTURING LIGHT EMITTING DIODE DISPLAY DEVICE

(71) Applicant: SAMSUNG ELECTRONICS CO., LTD., Suwon-si (KR)

(72) Inventors: Yoshihiro Yokote, Yokohama (JP); Katsutoshi Sasaki, Yokohama (JP); Dai Aoki, Yokohama (JP); Tsubasa Fujiwara, Yokohama (JP); Atsushi Sato, Yokohama (JP)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/072,793

(22) PCT Filed: Jan. 17, 2017

(86) PCT No.: PCT/KR2017/000552
§ 371 (c)(1),
(2) Date: Jul. 25, 2018

(87) PCT Pub. No.: WO2017/150804
PCT Pub. Date: Sep. 8, 2017

(65) Prior Publication Data
US 2019/0035979 A1 Jan. 31, 2019

(30) Foreign Application Priority Data
Feb. 29, 2016 (JP) ................................. 2016-036931

(51) Int. Cl.
*H01L 33/36* (2010.01)
*H01L 33/56* (2010.01)
(Continued)

(52) U.S. Cl.
CPC .......... *H01L 33/36* (2013.01); *H01L 23/3114* (2013.01); *H01L 33/005* (2013.01);
(Continued)

(58) Field of Classification Search
CPC ......... H01L 33/36; H01L 33/56; H01L 33/52; H01L 33/62
See application file for complete search history.

(56) References Cited

U.S. PATENT DOCUMENTS 5,471,023 A * 11/1995 Kaizu .................. H01H 13/702
200/292
8,232,117 B2 7/2012 Basin et al.
(Continued)

FOREIGN PATENT DOCUMENTS

JP 62-199073 A 9/1987
JP 8-15574 A 1/1996
(Continued)

OTHER PUBLICATIONS

Naka et al., Japanese Application No. JP2015-255502 (Year: 2015).*
(Continued)

*Primary Examiner* — Michele Fan
(74) *Attorney, Agent, or Firm* — Sughrue Mion, PLLC

(57) ABSTRACT

Provided are a light emitting diode capable of improving contrast, a method for manufacturing a light emitting diode, a light emitting diode display device, and a method for manufacturing a light emitting diode display device. The light emitting diode according to an embodiment comprises a package substrate having an electrode provided therein; a light emitting diode chip provided on the package substrate; a power line electrically connecting the light emitting diode chip to the electrode; and a black layer covering the electrode including a part connected to the power line.

10 Claims, 12 Drawing Sheets

(51) Int. Cl.
*H01L 33/54* (2010.01)
*H01L 23/31* (2006.01)
*H01L 33/00* (2010.01)
*H01L 33/52* (2010.01)
H01L 33/62 (2010.01)
G09G 3/32 (2016.01)

(52) U.S. Cl.
CPC ............. *H01L 33/52* (2013.01); *H01L 33/54* (2013.01); *H01L 33/56* (2013.01); *G09G 3/32* (2013.01); *H01L 33/62* (2013.01); *H01L 2224/49113* (2013.01); *H01L 2933/005* (2013.01); *H01L 2933/0066* (2013.01)

(56) References Cited

U.S. PATENT DOCUMENTS

| | | | | |
|---|---|---|---|---|
| 2004/0262623 | A1* | 12/2004 | You | G02F 1/133603 257/80 |
| 2009/0231849 | A1* | 9/2009 | Tseng | F21K 9/00 362/249.02 |
| 2010/0067243 | A1* | 3/2010 | Muraguchi | H01L 31/0203 362/382 |
| 2010/0155917 | A1 | 6/2010 | Maruo | |
| 2011/0303945 | A1* | 12/2011 | Zitzlsperger | H01L 21/4842 257/99 |
| 2013/0037702 | A1* | 2/2013 | Minamikawa | H01L 25/167 250/221 |
| 2013/0100621 | A1* | 4/2013 | Kudo | H01L 33/486 361/757 |
| 2014/0001648 | A1* | 1/2014 | Nakamura | H01L 23/49827 257/774 |
| 2015/0091027 | A1* | 4/2015 | Okura | H01L 33/58 257/88 |
| 2015/0092414 | A1* | 4/2015 | Okura | H01L 33/60 362/260 |
| 2015/0097207 | A1* | 4/2015 | Chen | H01L 23/38 257/99 |
| 2016/0254423 | A1* | 9/2016 | Bergmann | H01L 33/54 257/89 |
| 2017/0186927 | A1* | 6/2017 | Naka | H01L 33/60 |
| 2018/0076368 | A1* | 3/2018 | Hussell | H01L 33/52 |
| 2018/0226552 | A1* | 8/2018 | Lee | H01L 33/50 |

FOREIGN PATENT DOCUMENTS

| | | |
|---|---|---|
| JP | 2000-22221 A | 1/2000 |
| JP | 2002-176199 A | 6/2002 |
| JP | 2004-200236 A | 7/2004 |
| JP | 4299535 B2 | 7/2009 |
| JP | 2010-166021 A | 7/2010 |
| JP | 2011-253846 A | 12/2011 |
| JP | 2013-254820 A | 12/2013 |
| KR | 10-2013-0095190 A | 8/2013 |

OTHER PUBLICATIONS

International Search Report (PCT/ISA/210) dated Apr. 17, 2017, issued by the International Searching Authority in counterpart International Patent Application No. PCT/KR2017/000552.
Written Opinion (PCT/ISA/237) dated Apr. 17, 2017, issued by the International Searching Authority in counterpart International Patent Application No. PCT/KR2017/000552.

\* cited by examiner

LIGHT EMITTING DIODE, METHOD FOR MANUFACTURING LIGHT EMITTING DIODE, LIGHT EMITTING DIODE DISPLAY DEVICE, AND METHOD FOR MANUFACTURING LIGHT EMITTING DIODE DISPLAY DEVICE

TECHNICAL FIELD

The present disclosure relates to a light emitting diode, a method for manufacturing a light emitting diode, a light emitting diode display device, and a method for manufacturing a light emitting diode display device, and more specifically, to a light emitting diode capable of improving contrast, a method for manufacturing a light emitting diode, a light emitting diode display device, and a method for manufacturing a light emitting diode display device.

BACKGROUND ART

A light emitting diode display device is a device that includes a plurality of light emitting diodes arranged as pixels on a printed circuit board. A light emitting diode (also referred to as an LED) has a structure including a light emitting diode chip and a package substrate. The light emitting diode chip includes a p-type semiconductor and an n-type semiconductor, which are pn-connected to an electrode on the package substrate. The light emitting diode chip and the electrode on the package substrate are connected by, for example, conduction wires. Gold or silver paste, gold wire, copper wire, or the like is used for the electrode and the conduction wires on the package substrate. A metal having a high reflectivity to visible light is used as a metal for the electrode and power line. Therefore, when visible light is incident on the light emitting diode from the outside, visible light is reflected from the electrode, the power line, and in some cases, a surface of the package substrate. This causes deterioration of the contrast of the light emitting diode display device.

Patent Document 1 (Japanese Patent No. 4299535) discloses a light emitting diode display device in which a black resist is formed on a package substrate, and reflection of visible light incident from the outside onto a light emitting diode is suppressed.

In the light emitting diode display device of Patent Document 1, an opening is provided in the black resist. Then, a light emitting diode chip is disposed in the opening of the black resist. A part of an electrode provided on a package substrate is exposed to the opening of the black resist. A conduction wire that supplies current to the light emitting diode chip is connected to the electrode exposed in the opening.

As described above, since the electrode of the light emitting diode display device of Patent Document 1 has a part which is not covered with the black resist, incident light from the outside is reflected at this part. Therefore, it is difficult to improve the contrast of the light emitting diode and the light emitting diode display device.

DESCRIPTION OF EMBODIMENTS

Technical Problem

Provided are a light emitting diode capable of improving contrast, a method for manufacturing a light emitting diode, a light emitting diode display device, and a method for manufacturing a light emitting diode display device.

Solution to Problem

According to an aspect of the present disclosure, a light emitting diode includes a package substrate on which an electrode is provided; a light emitting diode chip mounted on the package substrate; a power line configured to electrically connect the light emitting diode chip to the electrode; and a black layer covering the electrode including a part connected to the power line. Due to this configuration, since the electrode may be covered with the black layer with low reflectance, reflection of incident light incident from the outside may be suppressed, and contrast may be improved.

When a thickness from an upper surface of the package substrate to an upper surface of the black layer is A and a thickness from the upper surface of the package substrate to an upper surface of the light emitting diode chip is B, A/B may be 1.0 or less. Due to this configuration, the influence of the black layer on an amount of light emission from the light emitting layer may be suppressed.

The light emitting diode chip may include a light emitting layer, and, when a thickness from an upper surface of the package substrate to an upper surface of the black layer is A and a thickness from the upper surface of the package substrate to a lower surface of the light emitting layer is C, A/C may be 1.0 or less. Due to this configuration, the influence of the black layer on an amount of light emission from the light emitting layer may be suppressed.

An upper surface of the black layer may be located above an upper surface of the electrode, and the upper surface of the black layer is substantially planar. Due to this configuration, the regularly reflected light of incident light from the outside by the black layer may be prevented from reaching the field of view of an observer of the light emitting diode display device.

The black layer may be an epoxy resin or a silicone resin to which a coloring agent is added. Due to this configuration, the transmittance of visible light in the black layer may be reduced, and reflection of incident light from the outside may be suppressed.

The light emitting diode may further include: a submount between the light emitting diode chip and the package substrate. Due to this configuration, the thickness of the black layer may be increased by the thickness of the submount, and the transmittance of the black layer may be reduced, and thus reflection of incident light from the outside may be suppressed.

An arrangement of the light emitting diode chip may be of a face up chip type. Due to this configuration, mounting of the light emitting diode chip may be facilitated.

An arrangement of the light emitting diode chip may be of a flip chip type. Due to this configuration, the contrast of the light emitting diode mounted with the light emitting diode chip may be improved.

According to another aspect of the present disclosure, a method of manufacturing a light emitting diode includes bonding a light emitting diode chip to a package substrate provided with an electrode; electrically connecting the light emitting diode chip to the electrode by a power line; and forming a black layer on the package substrate to cover the electrode including a part connected to the power line. Due to this configuration, since the black layer is formed after the light emitting diode chip and the electrode are connected by the power line, a part of the power line may also be covered by the black layer. Therefore, reflection by the power line may be suppressed.

The bonding of the light emitting diode chip to the package substrate provided with the electrode may include bonding a plurality of the light emitting diode chips to a wafer; forming the light emitting diode chip bonded on a submount by dicing the wafer to which the plurality of the light emitting diode chips are bonded; and bonding the light emitting diode chip bonded on the submount onto the package substrate. Due to this configuration, the light emitting diode having the submount may be easily formed, and the thickness of the black layer may be increased by the thickness of the submount.

The bonding of the light emitting diode chip to the package substrate provided with the electrode may include forming the electrode and a submount by etching an electrode layer provided on the package substrate; and bonding the light emitting diode chip to the package substrate by bonding the light emitting diode chip on the submount. Due to this configuration, the light emitting diode having the submount may be easily formed, and the thickness of the black layer may be increased by the thickness of the submount.

The bonding of the light emitting diode chip to the package substrate provided with the electrode may include inclining a side surface of a substrate disposed below the light emitting diode chip to become wider downward and using the substrate as a submount; and bonding the light emitting diode chip formed on the submount onto the package substrate. Due to this configuration, the manufacturing cost may be reduced.

The forming of the black layer on the package substrate may include coating the black layer on the package substrate with a dispenser. Due to this configuration, the manufacturing cost may be reduced.

According to another aspect of the present disclosure, the forming of the black layer on the package substrate may include coating the black layer on the package substrate by silk printing. Due to this configuration, the contrast of the light emitting diode display device may be improved.

According to another aspect of the present disclosure, a light emitting diode display device includes a printed substrate; and the light emitting diode, wherein a plurality of light emitting diodes are mounted on the printed substrate in parallel.

Due to this configuration, the contrast of the light emitting diode display device may be improved.

Advantageous Effects of Disclosure

According to the embodiments described above, a light emitting diode capable of improving contrast, a method for manufacturing a light emitting diode, a light emitting diode display device, and a method for manufacturing a light emitting diode display device may be provided.

BRIEF DESCRIPTION OF DRAWINGS

FIG. 2A is a diagram illustrating a light emitting diode according to the first embodiment, wherein FIG. 2A shows a top view of the light emitting diode before forming a black layer.

FIG. 2B is a diagram illustrating a light emitting diode according to the first embodiment, wherein FIG. 2B shows a top view of the light emitting diode after forming the black layer.

FIG. 2C is a diagram illustrating a light emitting diode according to the first embodiment, wherein FIG. 2C shows a side view of the light emitting diode passing through the black layer.

FIG. 4A is a diagram illustrating a light emitting diode according to a second embodiment, wherein FIG. 4A shows a top view of the light emitting diode before forming a black layer.

FIG. 4B is a diagram illustrating a light emitting diode according to the second embodiment, wherein FIG. 4B shows a top view of the light emitting diode after forming the black layer.

FIG. 4C is a diagram illustrating a light emitting diode according to the second embodiment, wherein

FIG. 5A is a diagram illustrating a light emitting diode according to a third embodiment, wherein FIG. 5A shows a top view of the light emitting diode before forming a black layer.

FIG. 5B is a diagram illustrating a light emitting diode according to the third embodiment, wherein FIG. 5B shows a top view of the light emitting diode after forming the black layer.

FIG. 5C is a diagram illustrating a light emitting diode according to the third embodiment, wherein

FIG. 6A is a diagram illustrating a light emitting diode according to a fourth embodiment, wherein FIG. 6A shows a top view of the light emitting diode before forming a black layer.

FIG. 6B is a diagram illustrating a light emitting diode according to the fourth embodiment, wherein FIG. 6B shows a top view of the light emitting diode after forming the black layer.

FIG. 6C is a diagram illustrating a light emitting diode according to the fourth embodiment, wherein FIG. 6C shows a side view of the light emitting diode passing through the black layer.

FIG. 7 is a diagram illustrating a light emitting diode according to a fifth embodiment, wherein FIG. 7 shows a side view of the light emitting diode passing through a black layer.

FIG. 8A is a diagram illustrating a light emitting diode according to a seventh embodiment, wherein FIG. 8A shows a top view of the light emitting diode before forming a black layer.

FIG. 8B is a diagram illustrating a light emitting diode according to the seventh embodiment, wherein FIG. 8B shows a side view of the light emitting diode passing through the black layer.

MODE OF DISCLOSURE

First Embodiment

Figure 1:
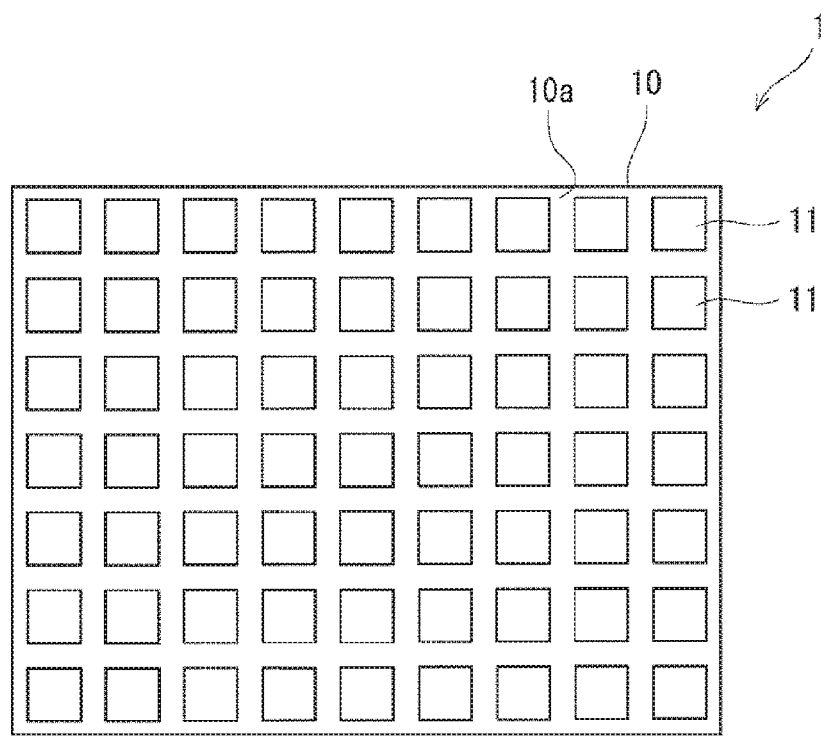
FIG. 1 is a top view illustrating a light emitting diode display device according to a first embodiment.

A light emitting diode display device 1 according to a first embodiment will be described. First, a configuration of the light emitting diode display device 1 will be described. FIG. 1 is a top view illustrating the light emitting diode display device 1 according to the first embodiment.

As shown in FIG. 1, the light emitting diode display device 1 may include a printed circuit board 10 and a plurality of light emitting diodes 11. The printed circuit board 10 may be, for example, a member in which a circuit or the like is printed on an insulating member. The printed circuit board 10 may be a plate-like member. When one surface of the printed circuit board 10 is an upper surface 10*a*, the upper surface 10*a* is rectangular. In the light emitting diode display device 1, the plurality of light emitting diodes 11 may be mounted on the printed circuit board 10 side by side. The plurality of light emitting diodes 11 may be arranged, for example, in an array.

Figure 2A:
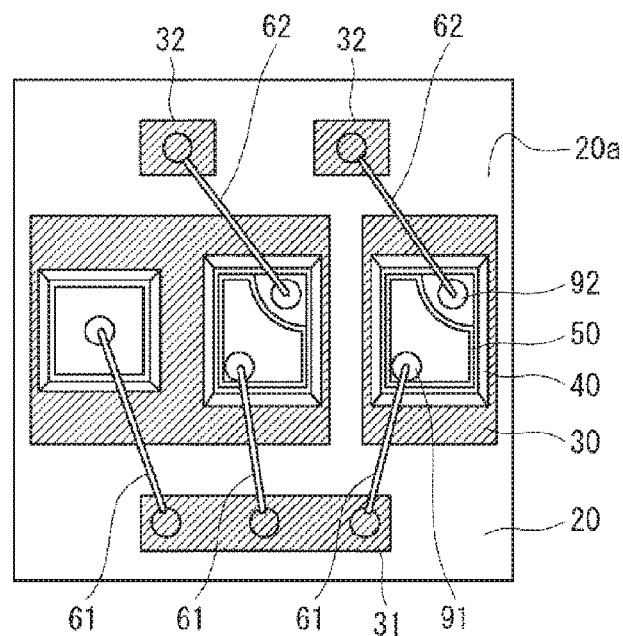
Figure 2B:
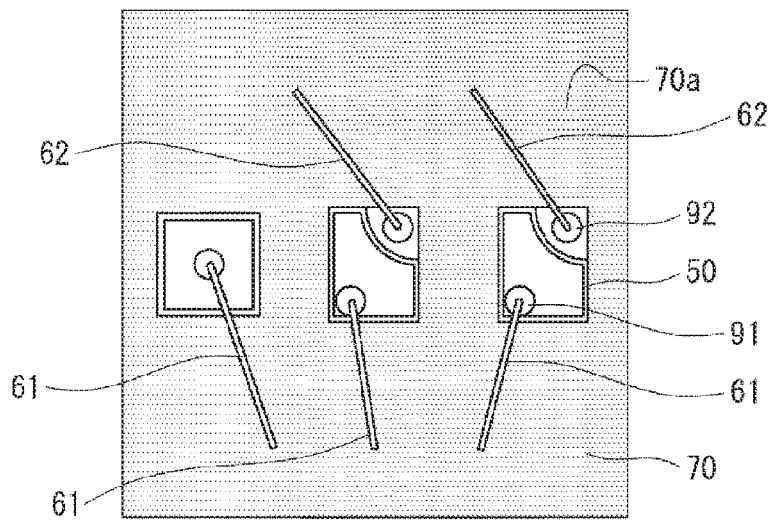
Figure 2C:
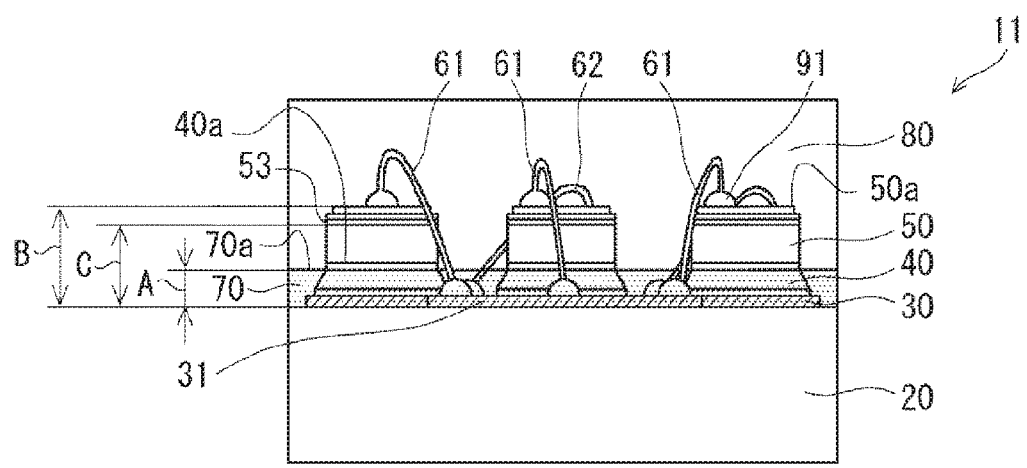

Next, the light emitting diodes 11 constituting pixels of the light emitting diode display device 1 will be described. FIGS. 2A, 2B, and 2C are diagrams illustrating the light emitting diodes 11 according to the first embodiment, wherein FIG. 2A shows a top view of the light emitting diode before 11 forming a black layer 70, FIG. 2B shows a top view of the light emitting diode 11 after forming the black layer 70, and FIG. 2C shows a side view passing of the light emitting diode 11 through the black layer 70.

As shown in FIGS. 2A, 2B, and 2C, the light emitting diode 11 may include a package substrate 20, electrodes 30 to 32, a submount 40, one or a plurality of light emitting diode chips 50, power lines 61 and 62, the black layer 70 and an encapsulation layer 80.

The package substrate 20 may be, for example, a plate-like member. The package substrate 20 may be, for example, an insulating substrate. The plurality of electrodes 30 to 32 are provided on an upper surface 20*a* of the package substrate 20.

The electrodes 30 to 32 may be provided, for example, on the upper surface 20*a* of the package substrate 20 with a space therebetween. For example, the electrode 30 may be disposed between the electrode 31 and the electrode 32. The electrodes 30 and 32 may be, for example, a cathode. The electrode 31 may be, for example, a bipolar electrode.

The submount 40 may be a plate-like member. The submount 40 may be mounted on the package substrate 20. The submount 40 may be disposed on the package substrate 20 with the electrodes 30 interposed therebetween. Namely, the submount 40 may be disposed on the electrode 30 provided on the package substrate 20. Meanwhile, the submount 40 may be provided on the package substrate 20 without the electrode 30 interposed therebetween.

One of plate surfaces of the submount 40 may be an upper surface, and the other plate surface may be a lower surface. The lower surface of the submount 40 may be bonded to the electrode 30 or the package substrate 20. The side surface of the submount 40 may be inclined. For example, when viewed from above, an edge of the lower surface may be outside an edge of the upper surface. Therefore, the side surface of the submount 40 may be inclined so that a width becomes wider from the edge of the upper surface to the edge of the lower surface as viewed from the side. The submount 40 may include, for example, silicon. Further, the side surface of the submount 40 may be a surface orthogonal to the upper surface and the lower surface without being inclined.

The light emitting diode chip 50 may be mounted on the package substrate 20. The light emitting diode chip 50 may have a rectangular parallelepiped shape. The light emitting diode chip 50 may be disposed on the package substrate 20 with the electrode 30 and the submount 40 interposed therebetween. That is, the light emitting diode chip 50 may be mounted on the submount 40. Therefore, the submount 40 is provided between the light emitting diode chip 50 and the package substrate 20.

Figure 3A:
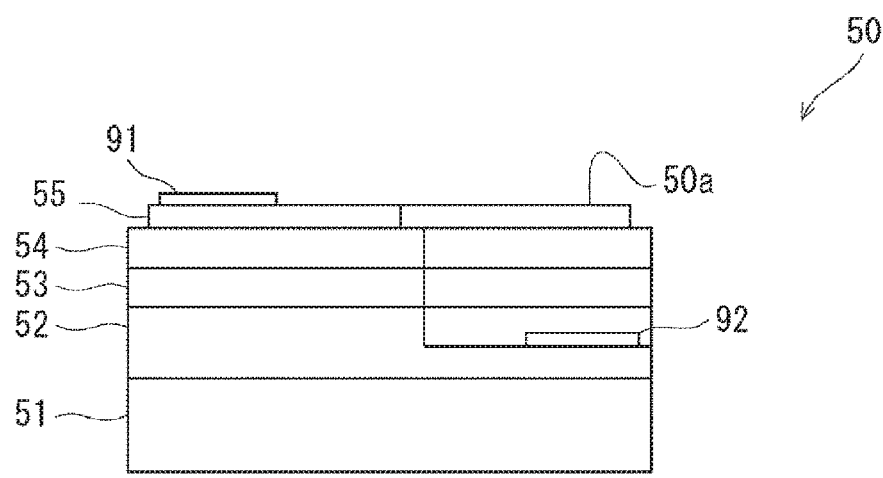
FIG. 3A is a diagram illustrating a light emitting diode chip according to the first embodiment.

FIG. 3A is a diagram illustrating the light emitting diode chip 50 according to the first embodiment. As shown in FIG. 3A, the light emitting diode chip 50 may be a pn junction of a p-type semiconductor and an n-type semiconductor. For example, the light emitting diode chip 50 may include a substrate 51 including silicon or sapphire or the like; an n-type gallium nitride (n-GaN) layer 52 provided on the substrate 51; a light emitting layer 53 provided on the n-type gallium nitride (n-GaN) layer 52; a p-type gallium nitride (p-GaN) layer 54 provided on the light-emitting layer 53; a transparent electrode 55 provided on the p-type gallium nitride layer 54; a pad 91 connected to the p-type gallium nitride layer 54; and a pad 92 connected to the n-type gallium nitride (n-GaN) layer 52.

As shown in FIGS. 2A to 2C and FIG. 3A, the pad 91 may be provided on an upper surface 50*a* of the light emitting diode chip 50. Further, the light emitting diode chip 50 may be provided with a pad 92 facing upward. Thus, an arrangement of the light-emitting diode chips 50 may be of a face-up chip type.

The power lines 61 and 62 may be, for example, linear members. The power lines 61 and 62 may be conduction wires such as a gold wire or a copper wire. One end of the power line 61 may be connected to the electrode 31. The other end of the power line 61 may be connected to the pad 91 of the light emitting diode chip 50. One end of the power line 62 may be connected to the electrode 32. The other end of the power line 62 may be connected to the pad 92 of the light emitting diode chip 50. Accordingly, the power lines 61 and 62 may electrically connect the light emitting diode chip 50 and the electrodes 31 and 32 to each other.

The black layer 70 may be provided on the package substrate 20. The black layer 70 may cover parts of the electrodes 31 and 32 to which the power lines 61 and 62 are connected. The black layer 70 may cover the electrodes 31 and 32 including the parts of the electrodes 31 and 32 to which the power lines 61 and 62 are connected. The black layer 70 may be obtained by adding a coloring agent to an epoxy resin or a silicone resin. By adding the coloring agent to the epoxy resin or silicone resin, the transmittance of visible light in the black layer 70 may be reduced.

An upper surface 70*a* of the black layer 70 is lower than the upper surface 50*a* of the light emitting diode chip 50. When the thickness from the upper surface 20*a* of the package substrate 20 to the upper surface 70*a* of the black layer 70 is A, and the thickness from the upper surface 20*a* of the package substrate 20 to the upper surface 50*a* of the light emitting diode chip 50 is B, A/B is 1.0 or less. When the thickness from the upper surface 20*a* of the package substrate 20 to the upper surface 70*a* of the black layer 70 is A and the thickness from the upper surface 20*a* of the package substrate 20 to a lower surface of the light emitting layer 53 of the light emitting diode chip 50 is C, A/C may be 1.0 or less. The upper surface 70*a* of the black layer 70 may be located above upper surfaces of the electrodes 30 to 32. The upper surface 70*a* of the black layer 70 may have a substantially planar shape. Thus, a part including the upper surface 50*a* of the light emitting diode chip 50 may be exposed from the upper surface 70*a* of the black layer 70 provided on the package substrate 20 and the electrodes 31 and 32 in a flat manner. The black layer 70 may cover a part including the upper surface 50*a* of the light emitting diode chip 50 and a part other than parts of the power lines 61 and 62 may be connected to the light emitting diode chip 50. The black layer 70 may cover the electrodes 31 and 32 without any exposed parts. In the present embodiment, the upper surface 70a of the black layer 70 is below an upper surface 40a of the submount 40.

The encapsulation layer 80 may be formed on the package substrate 20 to cover the electrodes 30 to 32, the submount 40, the light emitting diode chip 50, the power lines 61 and 62 and the black layer 70. The encapsulation layer 80 may include an epoxy resin or a silicone resin. A transparent material may be used as the epoxy resin or the silicone resin. Further, a coloring agent may be added to the epoxy resin or the silicone resin of the encapsulation layer 80. Also, scattering particles may be added to the epoxy resin or the silicone resin. Thus, the transmittance of light incident from the outside may be reduced. Next, a method of manufacturing the light emitting diode display device 1 according to the first embodiment will be described. First, the light emitting diode 11 is manufactured.

The plurality of light emitting diode chips 50 as shown in FIG. 3A are prepared. Subsequently, the plurality of light emitting diode chips 50 are bonded to a wafer. The wafer is, for example, a silicon wafer or a ceramic wafer. The plurality of light emitting diode chips 50 are bonded to an upper surface of the wafer.

Subsequently, the wafer on which the plurality of light emitting diode chips 50 are bonded is diced. For example, the wafer is diced using a diamond saw. Each part of the diced wafer becomes the submount 40. Thus, the light emitting diode chip 50 bonded onto the submount 40 is formed. A cross section of the diced wafer becomes a side surface of the submount 40. When an edge of the diamond saw used for dicing has a V-shaped cross section, dicing is performed with the diamond saw from an upper side of the wafer. Accordingly, the side surface of the submount 40 may be tilted to become wider from the upper edge toward the lower edge as viewed from the side. Further, when the edge of the diamond saw is inserted deeply, the side surface of the submount 40 may be a surface perpendicular to the upper surface and the lower surface.

Subsequently, the light emitting diode chip 50 bonded on the submount 40 is bonded onto the package substrate 20. Specifically, the lower surface of the submount 40, to which the light emitting diode chip 50 is bonded on the upper surface, is bonded to the electrode 30. In this way, the light emitting diode chip 50 is bonded to the package substrate 20 provided with the electrodes 30 to 32. The lower surface of the submount 40 may also be bonded to the upper surface of the package substrate 20 instead of the electrode 30.

Next, as shown in FIG. 2A, the light emitting diode chip 50 and the electrodes 31 and 32 are electrically connected to each other by power lines 61 and 62, respectively. Specifically, the light emitting diode chip 50 and the electrodes 31 and 32 are wire-bonded. Wire bonding is performed by connecting one end of the power line 61 to the pad 91 of the light emitting diode chip 50 and connecting the other end of the power line 61 to the electrode 31. Wire bonding is also performed by connecting one end of the power line 62 to the pad 92 of the light emitting diode chip 50 and connecting the other end of the power line 62 to the electrode 32.

Next, as shown in FIG. 2B, the black layer 70 is formed on the package substrate 20. The black layer 70 is formed to cover the electrode 31 including the part of the electrode 31 to which the power line 61 is connected. The black layer 70 is also formed to cover the electrode 32 including the part of the electrode 32 to which the power line 62 is connected. The black layer 70 is formed such that the upper surface 70a of the black layer 70 is below the upper surface 50a of the light emitting diode chip 50. When the thickness from the upper surface 20a of the package substrate 20 to the upper surface 70a of the black layer 70 is A, and the thickness from the upper surface 20a of the package substrate 20 to the upper surface 50a of the light emitting diode chip 50 is B, the black layer 70 is formed such that A/B is 1.0 or less. When the thickness from the upper surface 20a of the package substrate 20 to the upper surface 70a of the black layer 70 is A and the thickness from the upper surface 20a of the package substrate 20 to the lower surface of the light emitting layer 53 of the light emitting diode chip 50 is C, the black layer 70 is formed such that A/C is 1.0 or less. That is, the black layer 70 may not cover the side surface of the light emitting layer 53 of the light emitting diode chip 50.

The black layer 70 is formed such that the upper surface 70a of the black layer 70 is located above the upper surfaces of the electrodes 30 to 32. The black layer 70 is also formed such that the upper surface 70a of the black layer 70 has a substantially planar shape. In the present embodiment, the black layer 70 is formed such that the upper surface 70a of the black layer 70 is below the upper surface 40a of the submount 40. When the black layer 70 is formed on the package substrate 20, the black layer 70 may be coated on the package substrate 20 with a dispenser or the black layer 70 may be coated on the package substrate 20 by silk printing.

Subsequently, a resin is formed on the package substrate 20 to cover the electrodes 30 to 32, the submount 40, the light emitting diode chip 50, the power lines 61 and 62, and the black layer 70. The resin may be, for example, a transparent thermosetting epoxy resin or a silicone resin. A coloring agent may be added to the resin. Also, scattering particles may be added to the resin. Then, the resin formed on the package substrate 20 is cured. As a result, the resin is cured and the encapsulation layer 80 is formed.

Then, the encapsulation layer 80, the black layer 70 and the package substrate 20 are cut off to include the electrodes 30 to 32, the submount 40, the light emitting diode chip 50, and the power lines 61 and 62. Thus, the light emitting diode 11 shown in FIG. 2C is manufactured.

Next, as shown in FIG. 1, the plurality of light emitting diodes 11 are mounted on the printed circuit board 10 side by side. The plurality of light emitting diodes 11 are arranged, for example, in an array and mounted. Thus, the light emitting diode display device 1 is manufactured.

According to the plurality of light emitting diodes 11 of the present embodiment, the black layer 70 with a low reflectance covers the electrodes 30 to 32, parts of the power lines 61 and 62, and the upper surface 20a of the package substrate 20. The black layer 70 covers the part of the electrode 31 to which the power line 61 is connected and also covers the part of the electrode 32 to which the power line 62 is connected. Thus, the reflection of incident light from the outside may be suppressed from the electrodes 30 to 32, the parts of the power lines 61 and 62 and the upper surface 20a of the package substrate 20, and the contrast of the light emitting diode display device 1 may be improved. That is, when the light emitting diode display device 1 is OFF, blackness of a screen may be made more conspicuous.

Also, the upper surface 70a of the black layer 70 is lower than the upper surface 50a of the light emitting diode chip 50. That is, when the thickness from the upper surface 20a of the package substrate 20 to the upper surface 70a of the black layer 70 is A and the thickness from the upper surface 20a of the package substrate 20 to the to the upper surface 50a of the light emitting diode chip 50 is B, A/B is 1.0 or less. Therefore, an amount of light emitted from the upper surface 50a, which is a main light emitting surface, may be secured. More preferably, the thickness from the upper surface 20a of the package substrate 20 to the upper surface 70a of the black layer 70 is A and the thickness from the upper surface 20a of the package substrate 20 to the lower surface of the light emitting layer 53 is C, A/C is 1.0 or less. Therefore, the black layer 70 does not cover the side surface of the light emitting layer 53 of the light emitting diode chip 50. Therefore, the black layer 70 does not block the light emission from the end face (side face) of the light emitting layer 53, thereby suppressing the decrease of the amount of emitted light and preventing reduction of the viewing angle.

The upper surface 70a of the black layer 70 has a substantially planar shape. Therefore, the regularly reflected light of the incident light from the outside by the black layer 70 may be prevented from reaching the field of view of the observer. Generally, the light emitting diode display device 1 is used standing upright. The observer observes from a direction opposite to the upper surface 10a of the printed circuit board 10 of the light emitting diode display device 1. Therefore, when the upper surface 70a of the black layer 70 is formed in the substantially planar shape, the regularly reflected light of light incident from above, such as a daylight or an indoor illumination, reaches a bottom surface. Therefore, the regularly reflected light does not reach the observer, and thus the contrast may be improved.

Further, a coloring agent is added to the epoxy resin or silicone resin in the black layer 70. Thus, the transmittance of visible light from the outside in the black layer 70 may be reduced, and the reflection of incident light from the outside may be suppressed.

The submount 40 is provided between the light emitting diode chip 50 and the package substrate 20. Therefore, the thickness of the black layer 70 may be increased by the thickness of the submount 40. Further, by adjusting the thickness of the submount 40, the thickness of the black layer 70 may be adjusted. Therefore, the thickness of the black layer 70 may be adjusted in accordance with the transmittance of the black layer 70, and the reflection by the electrodes 31, 32 and the like may be suppressed.

When the upper surface 70a of the black layer 70 is below the upper surface 40a of the submount 40, since the light emitting diode chip 50 is not covered with the black layer 70, the reduction of an amount of emitted light may be suppressed. Also, by forming the submount 40, the black layer 70 may be prevented from contacting the light emitting diode chip 50. Thus, the influence of the surface tension by the light emitting diode chip 50 may be suppressed, thereby facilitating to coat the black layer 70 in a substantially planar shape.

Also, the side surface of the submount 40 may be inclined to widen outward from the edge of the upper surface of the submount 40 through the edge of the lower surface. Therefore, an amount of the black layer 70 covering the package substrate 20 may be reduced, and the cost may be reduced. A silicon wafer, a ceramic wafer, or a metal plate having a high thermal conductivity may be used for manufacturing the submount 40. Accordingly, heat generated in the light emitting diode chip 50 may be dissipated (discharged) through the submount 40, and the thermal influence may be suppressed.

Also, the light emitting diode chip 50 and the electrodes 31 and 32 may be wire-bonded to form the black layer 70. Therefore, since parts of the power lines 61 and 62 are also covered with the black layer 70, reflection by the power lines 61 and 62 may be suppressed.

When the black layer 70 is formed on the package substrate 20, a dispenser or silk printing may be used. Accordingly, the black layer 70 may be easily formed and the manufacturing cost may be reduced. Further, the black layer 70 may be easily formed in a substantially planar shape.

By using a transparent epoxy resin or a silicone resin as a material of the encapsulation layer 80, it may be possible to suppress the absorption of light and suppress the reduction of the amount of light emission. Addition of a coloring agent or scattering particles to the encapsulation layer 80 may decrease the amount of light emission but may reduce the light transmittance from the outside of the encapsulation layer 80 and suppress the reflection by the electrodes 31 and 32, etc.

When the encapsulation layer 80 is cut after being formed, a general semiconductor dicing apparatus may be used to manufacture the light emitting diode 11. Therefore, the manufacturing cost may be reduced.

First Modification

Next, a light emitting diode display device according to a first modification of the first embodiment will be described. In the present modification, the submount 40 may be formed by etching an electrode layer provided on the package substrate 20. The lower surface of the submount 40 may be in contact with the electrode 30 or the package substrate 20. The side surface of the submount 40 may be inclined to be wider from the upper edge to the lower edge by etching or may be a surface perpendicular to the upper surface and the lower surface. The other configuration is the same as in the first embodiment.

Next, a method of manufacturing the light emitting diode display device according to the first modification of the first embodiment will be described. In the present modification, the package substrate 20 provided with an electrode layer as the package substrate 20 is used. By etching the electrode layer provided on the package substrate 20, the submount 40 is formed at the same time when the electrodes 30 to 32 are formed. That is, the electrodes 30 to 32 and the submount 40 are formed by etching the electrode layer provided on the package substrate 20. Etching may be performed such that the upper surface of the submount 40 is positioned above the upper surfaces of the electrodes 31 and 32.

Subsequently, the light emitting diode chip 50 is bonded onto the submount 40. Thus, the light emitting diode chip 50 is bonded onto the package substrate 20. In this manner, the light emitting diode chip 50 is bonded onto the package substrate 20 provided with the electrodes 30 to 32. The other processes are the same as those in the first embodiment.

According to the present modification, operations of bonding the light emitting diode chip 50 to a wafer and dicing the wafer to which the light emitting diode chip 50 is bonded may be omitted, and thus, the manufacturing process may be shortened. Also, the submount 40 may include a metal such as an electrode. Therefore, the thermal conductivity may be improved. Further, the thickness of the submount 40 may be easily controlled via etching. The other effects are the same as those in the first embodiment.

Second Modification

Figure 3B:
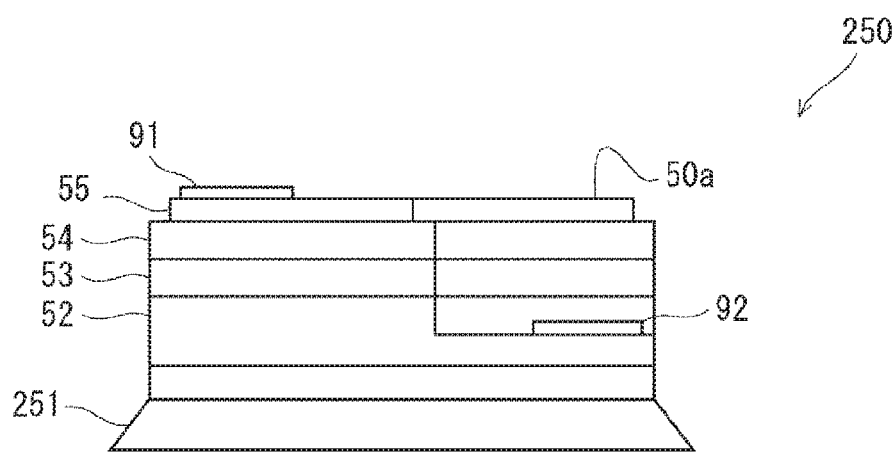
FIG. 3B is a diagram illustrating a light emitting diode chip according to a second modification of the first embodiment.

Next, a light emitting diode display device according to a second modification of the first embodiment will be described. FIG. 3B is a diagram illustrating a light emitting diode chip according to the second modification of the first embodiment. As shown in FIG. 3B, a substrate 251 of the light emitting diode chip 250 may have a trapezoidal shape. That is, a side surface of the substrate 251 may be inclined to become wider from the upper edge toward the lower side as viewed from the side. Thus, the side surface of the substrate 251 may have the same shape as a submount. Therefore, the substrate 251 may have the same function as the submount.

In the present modification, the light emitting diode chip 250 may be mounted on the submount 40, the substrate 251 and the submount 40 may have a function of the submount 40, and the light emitting diode chip 250 may be mounted on the electrode 30 or the package substrate 20, and thus, the substrate 251 may have the function of the submount 40. The other configurations are the same as those of the first embodiment.

In the method of manufacturing the present modification, when the light emitting diode chip 250 is cut, the substrate 251 is cut such that the side surface of the substrate 251 has a trapezoidal shape. An operation of bonding the light emitting diode chip 250 to the package substrate 20 provided with the electrodes 31 and 32 includes operations of forming the substrate 251 to be inclined such that the side surface of the substrate 251 disposed below the light emitting diode chip 250 is widened downward and forming the substrate 251 as a submount, and bonding the light emitting diode chip 250 formed on the submount onto the package substrate 20. The other operations are the same as those in the first embodiment.

According to the present modification, the substrate 251 of the light emitting diode chip 250 is formed as the submount. Therefore, since it is not necessary to form the submount by using the wafer, the cost of a material for manufacturing the submount 40 and the manufacturing cost for preparing the submount 40 may be reduced. The other effects are the same as in the first embodiment.

Second Embodiment

Figure 4A:
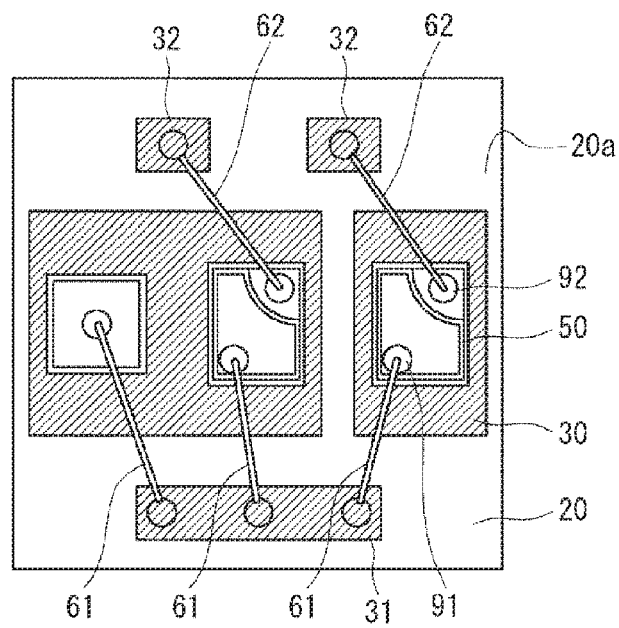
Figure 4B:
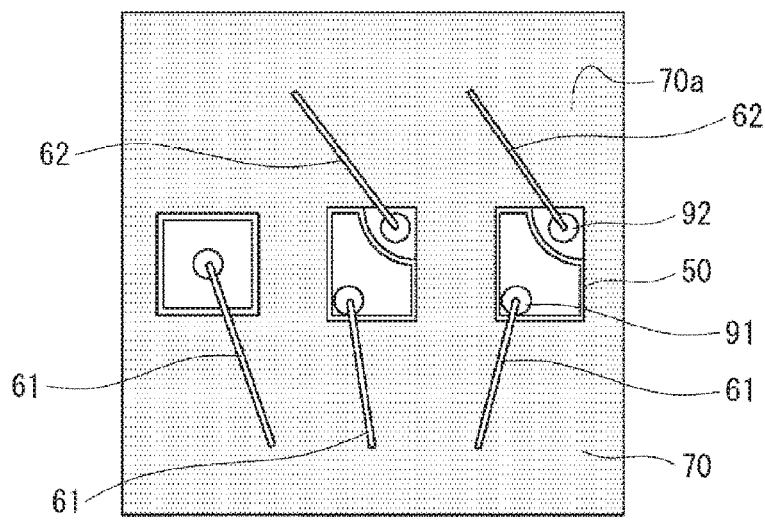
Figure 4C:
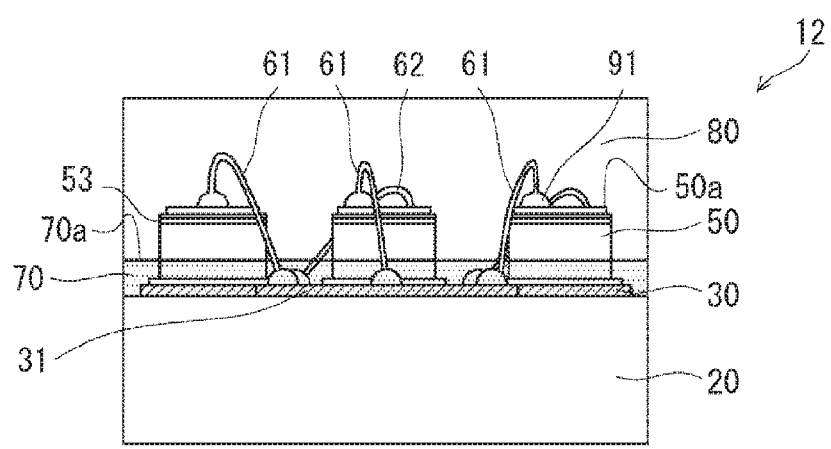

Next, a light emitting diode display device 2 according to a second embodiment will be described. In the light emitting diode display device 2 of the second embodiment, a light emitting diode 12 in which the submount 40 is omitted is used. FIGS. 4A, 4B, and 4C are diagrams illustrating the light emitting diode 12 according to the second embodiment, wherein FIG. 4A shows a top view of the light emitting diode 12 before forming a black layer 70, FIG. 4B shows a top view of the light emitting diode 12 after forming the black layer 70, and FIG. 4C shows a side view of the light emitting diode 12 passing through the black layer 70.

As shown in FIGS. 4A to 4C, the light emitting diode 12 in the light emitting diode display device 2 does not have the submount 40. The light emitting diode chip 50 is mounted on the package substrate 20. The light emitting diode chip 50 is disposed on the package substrate 20 with the electrodes 30 interposed therebetween. Further, the light emitting diode chip 50 may be provided on the package substrate 20 without interposing the electrode 30 therebetween.

The black layer 70 covers a part of the electrode 31 to which the power line 61 is connected and covers the portion of the electrode 32 to which the power line 62 is connected.

The upper surface 70a of the black layer 70 is located below the upper surface 50a of the light emitting diode chip 50. The upper surface 70a of the black layer 70 may be located below the light emitting layer 53 of the light emitting diode chip 50. The upper surface 70a of the black layer 70 is located above upper surfaces of the electrodes 30 to 32.

For example, in the present embodiment, the upper surface 70a of the black layer 70 is located on a side surface of the light emitting diode chip 50. The other configurations are the same as those in the first embodiment.

Next, a method of manufacturing the light emitting diode display device 2 according to the second embodiment will be described. First, to manufacture the light emitting diode 12, the plurality of the light emitting diode chips 50 shown in FIG. 3A are prepared. Subsequently, the plurality of light emitting diode chips 50 are bonded to the package substrate 20. Specifically, the light emitting diode chips 50 are bonded onto the electrode 30. Further, the light emitting diode chips 50 may be bonded to the upper surface 20a of the package substrate 20.

Subsequently, as shown in FIG. 4A, the light emitting diode chip 50 and the electrodes 31 and 32 are electrically connected by the power lines 61 and 62, respectively. One end of the power line 61 is connected to the pad 91 of the light emitting diode chip 50 and the other end of the power line 61 is connected to the electrode 31. One end of the power line 62 is connected to the pad 92 of the light emitting diode chip 50 and the other end of the power line 62 is connected to the electrode 32.

Next, as shown in FIG. 4B, the black layer 70 is formed on the package substrate 20. The black layer 70 is formed to cover the parts of the electrodes 31 and 32 to which the power lines 61 and 62 are connected. The upper surface 70a of the black layer 70 is disposed below the upper surface 50a of the light emitting diode chip 50. The upper surface 70a of the black layer 70 is located below a lower surface of the light emitting layer 53 of the light emitting diode chip 50 and above the upper surfaces of the electrodes 30 to 32. In the present embodiment, the black layer 70 is formed such that the upper surface 70a of the black layer 70 is located on the side surface of the light emitting diode chip 50. The other manufacturing operations in the present embodiment are the same as those in the first embodiment.

According to the light emitting diode 12 of the present embodiment, the submount 40 is not provided. Therefore, the cost of a material of the submount 40 and the manufacturing cost for providing the submount 40 may be reduced. Although the submount 40 is not provided in the present embodiment, the upper surface of the black layer 70 is located on the side surface of the light emitting diode chip 50 such that the thickness of the black layer 70 is increased. Therefore, reflection of incident light from the outside may be suppressed. The other effects are the same as those in the first embodiment.

Third Embodiment

Figure 5A:
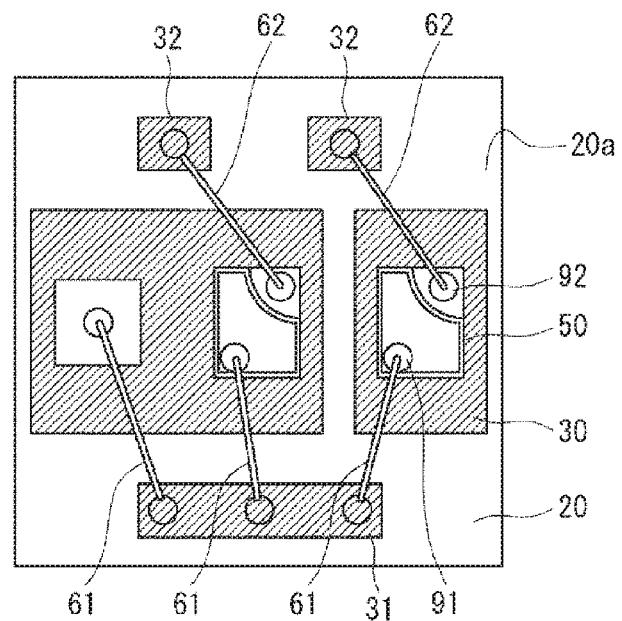
Figure 5B:
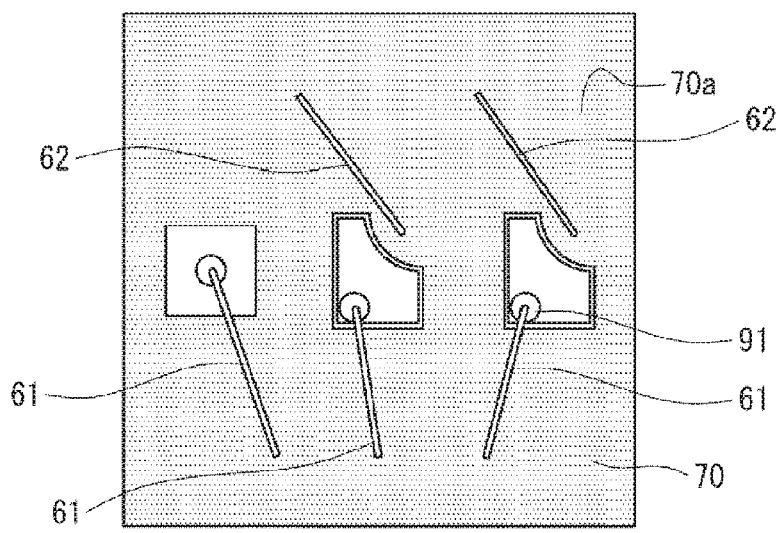
Figure 5C:
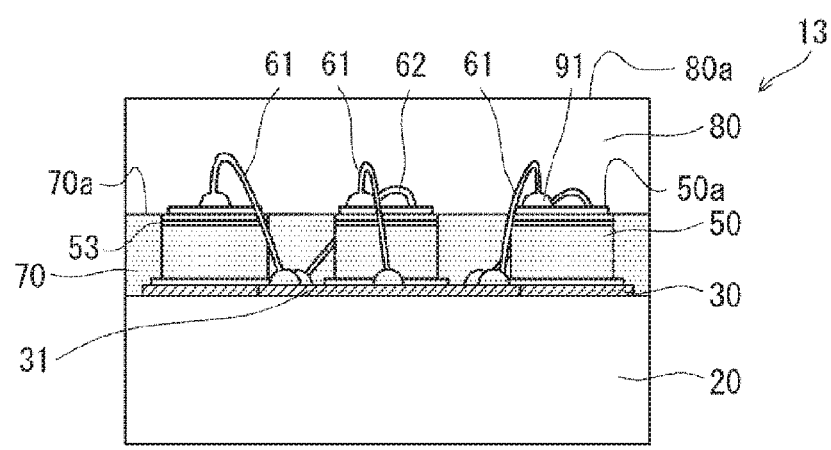
FIG. 5C shows a side view of the light emitting diode passing through the black layer.

Next, a light emitting diode 13 according to the third embodiment will be described. The light emitting diode 13 of the third embodiment is different from the light emitting diode 11 according to the first embodiment in that the light emitting diode 13 according to the third embodiment does not have the submount 40 and a side surface of the light emitting layer 53 of the light emitting diode chip 50 is covered with the black layer 70. FIGS. 5A, 5B, and 5C are diagrams illustrating the light emitting diode 13 according to the third embodiment, wherein FIG. 5A shows a top view of the light emitting diode 13 before forming the black layer 70, FIG. 5B shows a top view of the light emitting diode 13 after forming the black layer 70, and FIG. 5C shows a side view of the light emitting diode 13 passing through the black layer 70.

As shown in FIGS. 5A to 5C, the light emitting diode 13 does not have the submount 40. The light emitting diode chip 50 is mounted on the package substrate 20. The light emitting diode chip 50 is disposed on the package substrate 20 with the electrode 30 interposed therebetween. Further, the light emitting diode chip 50 may be provided on the package substrate 20 without interposing the electrode 30 therebetween.

In the present embodiment, the upper surface 70a of the black layer 70 is positioned below the upper surface 50a of the light emitting diode chip 50 and above upper surfaces of the electrodes 30 to 32. The black layer 70 covers a side surface of the light emitting layer 53 of the light emitting diode chip 50.

Scattering particles may be added to the encapsulation layer 80. Thus, the viewing angle may be increased. Instead of adding scattering particles to the encapsulation layer 80, a concavo-convex shape may be provided on the upper surface 80a of the encapsulation layer 80, or a diffusion film may be adhered thereto. Also, several scattering particles, concave-convex shapes, and diffusion films may be used in combination. The other configurations are the same as those of the first and second embodiments.

A method of manufacturing the light emitting diode 13 of the third embodiment is the same as the method of manufacturing the light emitting diode 12 of the second embodiment except that a position of the upper surface 70a of the black layer 70 is below the upper surface 50a of the light emitting diode chip 50 and above an upper surface of the light emitting layer 53 of the light emitting diode chip 50 when forming the black layer 70.

According to the light emitting diode 13 of the third embodiment, the black layer 70 covers the side surface of the light emitting layer 53 of the light emitting diode chip 50. Therefore, the thickness of the black layer 70 is increased, and the transmittance of the black layer 70 is reduced, and thus reflection of incident light from the outside by the electrodes 31 and 32 may be further suppressed.

Also, light emitted from the side surface of the light emitting layer 53 of the light emitting diode chip 50 is blocked by the black layer 70. Therefore, light emitted in an oblique direction from the side surface of the light emitting layer 53 of the light emitting diode chip 50 is reduced, and therefore, there is a possibility that the viewing angle characteristic is lowered. However, in this case, the scattering particles, the concavo-convex shape, the diffusion film, and the like are provided in the encapsulation layer 80, whereby deterioration of the viewing angle characteristic may be suppressed. Scattering particles, concavo-convex shape, diffusion film, and the like may be used in combination. The other effects are the same as those of the first and second embodiments.

Fourth Embodiment

Next, a light emitting diode 14 according to the fourth embodiment will be described. The light emitting diode 11 of the fourth embodiment differs from the light emitting diode 11 of the first embodiment in that a cover 85 is provided instead of providing the encapsulation layer 80.

Figure 6A:
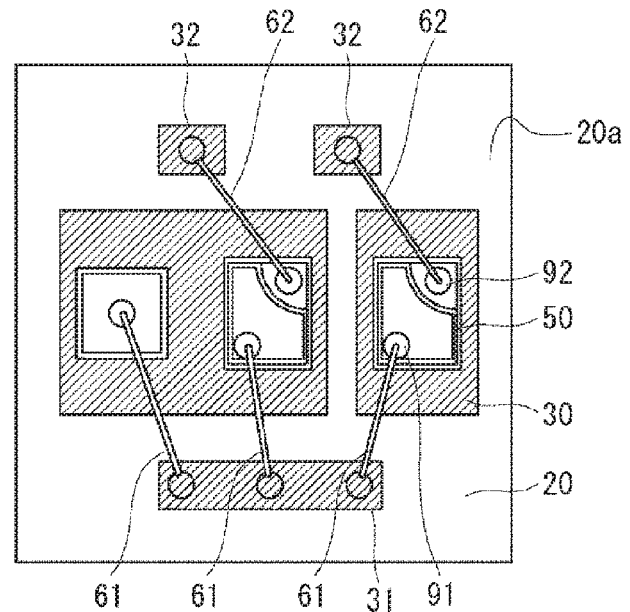
Figure 6B:
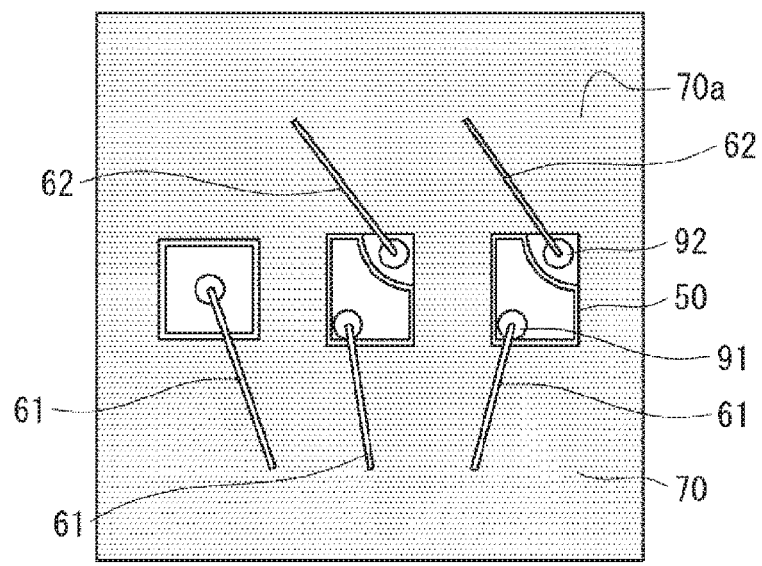
Figure 6C:
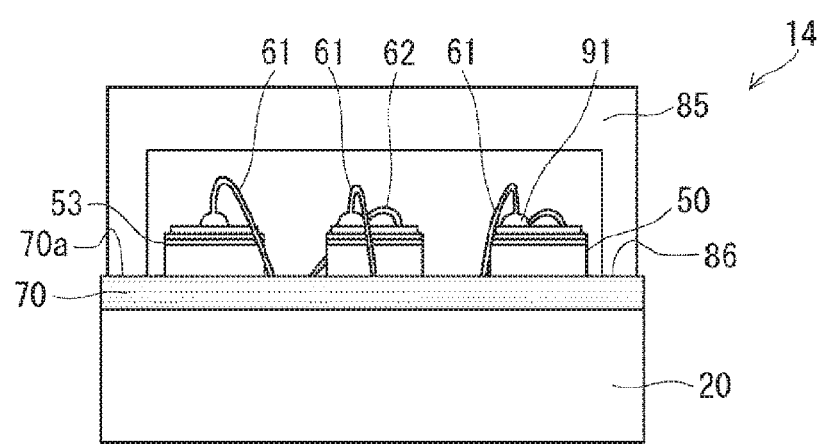

FIGS. 6A, 6B and 6C are diagrams illustrating the light emitting diode 14 according to the fourth embodiment, wherein FIG. 6A shows a top view of the light emitting diode 14 before forming the black layer 70, FIG. 6B shows a top view of the light emitting diode 14 after forming the black layer 70, and FIG. 6C shows a side view of the light emitting diode 14 passing through the black layer 70.

As shown in FIGS. 6A to 6C, the light emitting diode 14 does not have the encapsulation layer 80. Instead of providing the encapsulation layer 80, the cover 85 is provided. The cover 85 is mounted on the package substrate 20 and the black layer 70 to surround the electrodes 30 to 32, the submount 40, the light emitting diode chip 50 and the power lines 61 and 62. Spaces between the cover 85 and the electrodes 30 to 32, the submount 40, the light emitting diode chip 50 and the power lines 61 and 62 are cavity. The cover 85 may include, for example, resin or glass as a material. Scattering particles or a coloring agent may be added to the cover 85 to adjust the transmittance. The other configurations are the same as those in the first embodiment.

In a method of manufacturing the light emitting diode 14 of the fourth embodiment, instead of forming the encapsulation layer 80 in the method of manufacturing the light emitting diode 11 of the first embodiment, the cover 85 is bonded onto the package substrate 20 and the black layer 70 to surround the electrodes 30 to 32, the submount 40, the light emitting diode chip 50 and the power lines 61 and 62. A concave is formed in a part of the cover 85 corresponding to each light emitting diode 14 and a bonding surface 86 with the black layer 70 is formed between the light emitting diodes 14 of the cover 85. Therefore, each light emitting diode 14 is surrounded by another concave. That is, each light emitting diode 14 is individually surrounded by the concave. The cover 85, the black layer 70 and the package substrate 20 are cut out to pass through the bonding surface 86 of the cover 85 to form the light emitting diode 14. The electrodes 30 to 32 of the one light emitting diode 14, the submount 40, the light emitting diode chip 50 and the power lines 61 and 62 are surrounded by the concaves of the cover 85. In this way, the light emitting diode 14 shown in FIG. 6C is manufactured. The other operations are the same as those in the method of manufacturing the light emitting diode 11 of the first embodiment.

According to the light emitting diode 14 of the fourth embodiment, the encapsulation layer 80 is not provided. Therefore, when the encapsulation layer 80 is formed by the light emitting diode chip 50, the power lines 61, 62, and the like, it is not damaged by heat treatment and deformation during heating. Therefore, deterioration of the quality of the light emitting diode chip 50 may be suppressed.

Fifth Embodiment

Figure 7:
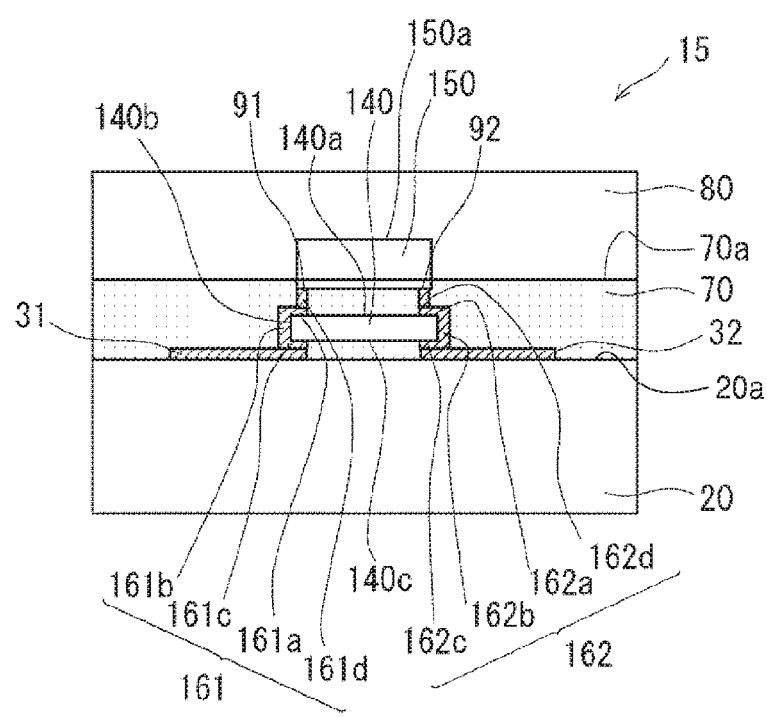

Next, a light emitting diode display device according to the fifth embodiment will be described. In the present embodiment, an arrangement of a light emitting diode chip 150 in a light emitting diode 15 is flip chip type. FIG. 7 is a diagram illustrating the light emitting diode 15 according to a fifth embodiment.

As shown in FIG. 7, the light emitting diode 15 of the present embodiment includes the package substrate 20, the electrodes 31 and 32, a submount 140, the light emitting diode chip 150, power lines 161 and 162, the black layer 70, and the encapsulation layer 80. The electrodes 31 and 32 are provided on the package substrate 20. The power line 161 includes wirings 161a to 161c and a bump 161d. The power line 162 includes wirings 162a to 162c and a bump 162d.

The wirings 161a to 161c are formed over an upper surface 140a, a side surface 140b and a lower surface 140c of the submount 140. The wirings 162a to 162c are formed over the upper surface 140a, the side surface 140b and the lower surface 140c of the submount 140. That is, the wirings 161a and 162a are formed on the upper surface 140a of the submount 140. The wirings 161b and 162b are formed on the side surface 140b of the submount 140. The wirings 161c and 162c are formed on the lower surface 140c of the submount 140.

The wirings 161c and 162c are connected to the electrodes 31 and 32, respectively. The pads 91 and 92 are provided on a lower surface of the light emitting diode chip 151. The bump 161d connects the pad 91 and the wiring 161a. The bump 162d connects the pad 92 and the wiring 162a.

The black layer 70 is provided on the package substrate 20. The black layer 70 covers parts of the electrodes 31 and 32 to which the power lines 161 and 162 are connected.

The upper surface 70a of the black layer 70 is below an upper surface 150a of the light emitting diode chip 150. When the thickness from the upper surface 20a of the package substrate 20 to the upper surface 70a of the black layer 70 is A and the thickness from the upper surface 20a of the package substrate 20 to the upper surface 150a of the light emitting diode chip 150 is B, A/B may be 1.0 or less. The upper surface 70a of the black layer 70 may be located above the upper surfaces of the electrodes 31 and 32 and the upper surface 70a of the black layer 70 is a substantially planar shape.

Next, a method of manufacturing the light emitting diode display device 5 of the present embodiment will be described. First, as shown in FIG. 7, a plurality of light emitting diode chips 150 that may be arranged in flip chip type are prepared. Also, the submount 140 is prepared. The wiring 161a, the wiring 161b and the wiring 161c are formed on the upper surface 140a, the side surface 140b and the lower surface 140c of the submount 140, respectively. Also, the wiring 162a, the wiring 162b and the wiring 162c are formed on the upper surface 140a, the side surface 140b and the lower surface 140c of the submount 140, respectively.

Subsequently, the light emitting diode chip 151 is bonded to the submount 140. In addition, the pad 91 of the light emitting diode chip 151 and the wiring 161a are connected by the bump 161d. Further, the pad 92 of the light emitting diode chip 151 and the wiring 162a are connected by the bump 162d.

Then, the submount 140 is bonded onto the package substrate 20 provided with the electrodes 31 and 32. Further, the wirings 161c and 162c are connected to the electrodes 31 and 32, respectively. Accordingly, the light emitting diode chip 150 is bonded to the package substrate 20 provided with the electrodes 31 and 32 and simultaneously the light emitting diode chip 150 and the electrodes 31 and 32 are electrically connected by the power lines 161 and 162. Subsequently, the black layer 70 is formed on the package substrate 20. Other manufacturing processes are the same as those in the first embodiment.

According to the light emitting diode display device 5 of the present embodiment, the arrangement of the light emitting diode chips 150 is flip chip type. Therefore, since there is no pad or power line on the upper surface of the light emitting diode chip 150, emitted light is not blocked and an amount of emitted light may be increased. The other effects are the same as those in the first embodiment.

Also, in the present embodiment, the submount 140 may not be provided. In that case, the power lines 161 and 162 include the bumps 161d and 162d. The bump 161d connects the pad 91 and the electrode 31 to each other. The bump 162d connects the pad 92 and the electrode 32 to each other.

Sixth Embodiment

Next, a light emitting diode display device according to the sixth embodiment will be described. In the present embodiment, the electrodes 31 and 32 are provided on the upper surface 10a of the printed circuit board 10. Then, the light emitting diode chips 50 are bonded onto the printed board 10. The light emitting diode chips 50 are bonded onto the printed circuit board 10 to be arranged, for example, in an array. The pads 91 and 92 of the light emitting diode chip 50 are electrically connected to the electrodes 31 and 32 provided on the printed circuit board 10 by the power lines 61 and 62, respectively.

The black layer 70 is formed on the printed circuit board 10 to cover parts of the electrodes 31 and 32 to which the power lines 61 and 62 are connected. Also, the black layer 70 is formed such that the upper surface 70a is below the upper surface 50a of the light emitting diode chip 50. The encapsulation layer 80 is provided on the printed circuit board 10 to cover the electrodes 30 to 32, the light emitting diode chip 50, the power lines 61 and 62, and the black layer 70. Also, the submount 40 may be provided between the printed circuit board 10 and the light emitting diode chip 50. Instead of the encapsulation layer 80, also, the cover 85 having a concave surrounding each light emitting diode chip 50 may be covered on the printed circuit board 10.

The light emitting diode display device described above has a structure in which the package substrate 20 and the upper surface 20a thereof are respectively the printed circuit board 10 and the upper surface 10a thereof in FIGS. 2A to 2C, 4A to 4C, 5A to 5C, 6A to 6C, and FIG. 7.

According to the present embodiment, the plurality of light emitting diode chips 50 are arranged on the printed circuit board 10. Therefore, the cost of a material for forming the light emitting diode 11 and the manufacturing cost for manufacturing the light emitting diode 11 may be reduced by using the package substrate 20. The other effects are the same as those of the first to fifth embodiments.

Seventh Embodiment

Next, a light emitting diode display device 7 according to the seventh embodiment will be described. In the present embodiment, a plurality of light emitting diodes 17 are mounted on an upper surface 320a of a package substrate 320 by mounting a plurality of electrodes and a plurality of light emitting diode chips 350 on the package substrate 320. The package substrate 320 on which the plurality of light emitting diodes 17 are mounted is used as the light emitting diode display device 7.

Figure 8A:
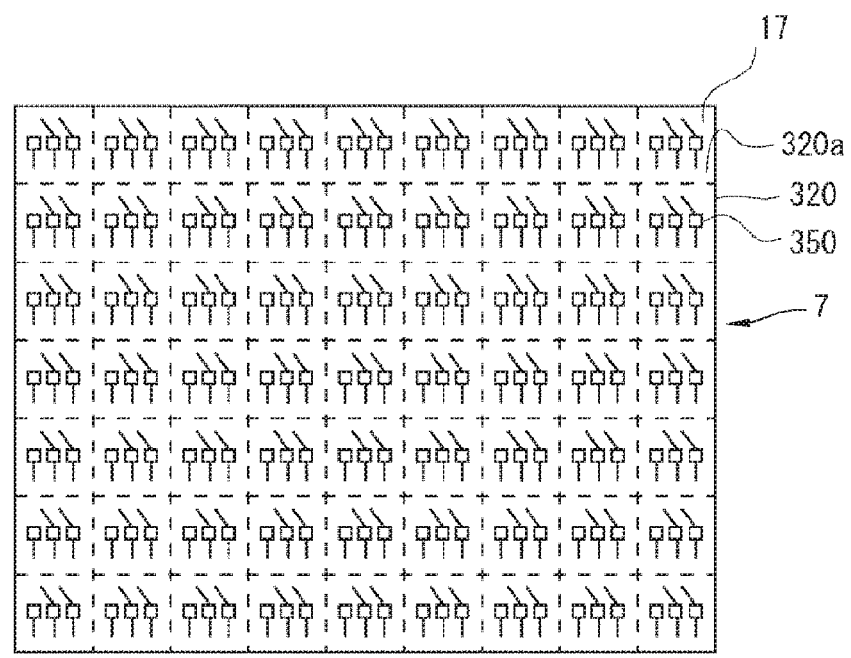
Figure 8B:
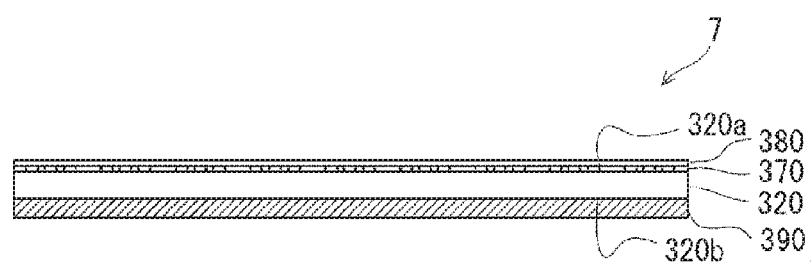

FIGS. 8A and 8B are diagrams illustrating the light emitting diode display device 7 according to the seventh embodiment, wherein FIG. 8A shows a top view of the light emitting diode 17 before forming a black layer 370, and FIG. 8B shows a side view of the light emitting diode 17 passing through the black layer 370. As shown in FIGS. 8A and 8B, a plurality of electrodes and the plurality of light emitting diode chips 350 are mounted on the upper surface 320a of the package substrate 320. Accordingly, a plurality of light emitting diodes 17 are formed as pixels. The light emitting diodes 17 serving as pixels are arranged, for example, in an array. Thereafter, the black layer 370 and an encapsulation layer 380 are formed on the package substrate 320. Then, the light emitting diode display device 7 is used without being diced. In this case, a circuit 390 is mounted on a back surface 320b of the package substrate 320. Also, in this state, it may be used as the light emitting diode display device 7, and a plurality of light emitting diode display devices may be stacked and used as a single large display.

According to the present embodiment, the plurality of light emitting diodes 17 are arranged as pixels in the package substrate 320. Therefore, the material cost and the manufacturing cost for forming the light emitting diode display device 7 may be reduced by using the printed circuit board 10. The other effects are the same as those of the first to sixth embodiments.

The first to seventh embodiments and the first and second modifications described above may be appropriately combined. Further, the present disclosure is not limited to the above-described embodiment, and may be appropriately changed without departing from the spirit of the disclosure.

For example, in any case where the submount 40 is provided or not, it may be appropriately modified, for example, the upper surface 70a of the black layer 70 is formed below the upper surface of the light emitting diode chip 50 and below the lower surface of the light emitting layer 53 and the lower surface of the submount 40 or the like. In the first to sixth embodiments and the modifications, any one of the encapsulation layer 80 and the cover 85 may be applied. In this case, a resin may have some of a coloring agent, diffusion particles, a concavo-convex shape on the upper surface, and a diffusion film.

The invention claimed is:

1. A light emitting diode comprising:
    a package substrate on which an electrode is provided;
    a light emitting diode chip mounted on the electrode, the light emitting diode chip comprising a light emitting layer;
    a power line configured to electrically connect the light emitting diode chip to the electrode; and
    a black layer provided on an upper surface of the package substrate, and covering the electrode and a part of the power line connected to the electrode,
    wherein a thickness from the upper surface of the package substrate to an upper surface of the black layer is A and a thickness from the upper surface of the package substrate to an upper surface of the light emitting diode chip is B, and A/B is 1.0 or less,
    wherein a thickness from the upper surface of the package substrate to a lower surface of the light emitting layer is C, and A/C is 1.0 or less, and
    wherein the upper surface of the black layer is located above an upper surface of the electrode.

2. The light emitting diode of claim 1, wherein the upper surface of the black layer is substantially planar.

3. The light emitting diode of claim 1, wherein the black layer is an epoxy resin or a silicone resin to which a coloring agent is added.

4. The light emitting diode of claim 1, further comprising:
    a submount between the light emitting diode chip and the package substrate.

5. The light emitting diode of claim 1, wherein an arrangement of the light emitting diode chip is of a face up chip type.

6. A light emitting diode display device comprising:
    a printed substrate; and
    a plurality of light emitting diodes mounted on the printed substrate in parallel,
    each of the plurality of light emitting diodes comprising:
        a package substrate on which an electrode is provided;
        a light emitting diode chip mounted on the electrode, the light emitting diode chip comprising a light emitting layer;
        a power line configured to electrically connect the light emitting diode chip to the electrode; and
        a black layer provided on an upper surface of the package substrate, and covering the electrode and a part of the power line connected to the electrode,
        wherein a thickness from the upper surface of the package substrate to an upper surface of the black layer is A and a thickness from the upper surface of the package substrate to an upper surface of the light emitting diode chip is B, and A/B is 1.0 or less,
        wherein a thickness from the upper surface of the package substrate to a lower surface of the light emitting layer is C, and A/C is 1.0 or less, and
        wherein the upper surface of the black layer is located above an upper surface of the electrode.

7. The light emitting diode display device of claim 6, wherein the upper surface of the black layer is substantially planar.

8. The light emitting diode display device of claim 6, wherein the black layer is an epoxy resin or a silicone resin to which a coloring agent is added.

9. The light emitting diode display device of claim 6, wherein each of the plurality of light emitting diodes further comprising:
    a submount between the light emitting diode chip and the package substrate.

10. The light emitting diode display device of claim 6, wherein an arrangement of the light emitting diode chip is of a face up chip type.

\* \* \* \* \*